United States Patent
Ratnam et al.

(10) Patent No.: US 9,941,022 B2
(45) Date of Patent: Apr. 10, 2018

(54) SETTING A DEFAULT READ SIGNAL BASED ON ERROR CORRECTION

(71) Applicant: Micron Technology, Inc., Boise, ID (US)

(72) Inventors: Sampath K. Ratnam, Boise, ID (US); Satish K. Yanamanamanda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/414,953

(22) Filed: Jan. 25, 2017

(65) Prior Publication Data

US 2017/0132076 A1    May 11, 2017

Related U.S. Application Data

(62) Division of application No. 14/977,088, filed on Dec. 21, 2015, now Pat. No. 9,582,362, which is a division
(Continued)

(51) Int. Cl.
G11C 29/50 (2006.01)
G11C 16/04 (2006.01)
(Continued)

(52) U.S. Cl.
CPC .... G11C 29/50004 (2013.01); G11C 16/0483 (2013.01); G11C 16/26 (2013.01); G11C 29/50 (2013.01); G11C 29/52 (2013.01)

(58) Field of Classification Search
CPC ....... G11C 29/029; G11C 29/42; G11C 29/52; G11C 29/50004; G11C 16/26;
(Continued)

(56) References Cited

U.S. PATENT DOCUMENTS 7,865,797 B2   1/2011   Eguchi et al.
7,886,212 B2   2/2011   Lasser
(Continued)

FOREIGN PATENT DOCUMENTS

CN    102483952    5/2012
JP    2009515281   4/2009
(Continued)

OTHER PUBLICATIONS

Office Action for related China Patent Application No. 201380072137.1, dated Mar. 9, 2017, 13 pages.
(Continued)

*Primary Examiner* — Vanthu Nguyen
(74) *Attorney, Agent, or Firm* — Brooks, Cameron & Huebsch, PLLC

(57) ABSTRACT

A number of methods can include reading a page of data from a group of memory cells with a first discrete read signal and error correcting at least one codeword of the page of data as read with the first discrete read signal. Methods can include reading a page of data from the group of memory cells with a second discrete read signal different than the first discrete read signal and error correcting at least one codeword of the page of data as read with the second discrete read signal. One of the first and the second discrete read signals can be set as a default read signal based at least in part on the respective error corrections.

21 Claims, 7 Drawing Sheets

Related U.S. Application Data of application No. 13/706,851, filed on Dec. 6, 2012, now Pat. No. 9,257,203.

(51) Int. Cl.
*G11C 16/26* (2006.01)
*G11C 29/52* (2006.01)

(58) Field of Classification Search
CPC .............. G11C 11/5642; G11C 29/021; G11C 2029/5004; G11C 16/0483; G06F 3/0683; G06F 11/1076; G06F 3/0619
See application file for complete search history.

(56) References Cited

U.S. PATENT DOCUMENTS

| | | |
|---|---|---|
| 7,890,818 B2 | 2/2011 | Kong et al. |
| 7,924,614 B2 | 4/2011 | Chen et al. |
| 7,954,037 B2 | 5/2011 | Lasser et al. |
| 7,957,187 B2 | 6/2011 | Mokhlesi et al. |
| 8,108,755 B2 | 1/2012 | Lee et al. |
| 8,139,412 B2 | 3/2012 | Kohler et al. |
| 8,156,398 B2 | 4/2012 | Sommer |
| 8,159,881 B2 | 4/2012 | Yang |
| 8,164,953 B2 | 4/2012 | Chen et al. |
| 8,179,718 B2 | 5/2012 | Cho et al. |
| 8,239,747 B2 | 8/2012 | Cho et al. |
| 8,719,647 B2 | 5/2014 | Bedeschi |
| 8,804,435 B2 | 8/2014 | Matsunaga |
| 2007/0091677 A1 | 4/2007 | Lasser et al. |
| 2007/0297226 A1 | 12/2007 | Mokhlesi |
| 2009/0177931 A1 | 7/2009 | Song et al. |
| 2009/0300465 A1 | 12/2009 | Wu et al. |
| 2010/0064200 A1 | 3/2010 | Choi et al. |
| 2010/0110815 A1 | 5/2010 | Lee et al. |
| 2010/0177564 A1 | 7/2010 | Feeley et al. |
| 2010/0251075 A1 | 9/2010 | Takahashi et al. |
| 2010/0322007 A1 | 12/2010 | Jeon |
| 2011/0296274 A1 | 12/2011 | Mittelholzer et al. |
| 2011/0307758 A1 | 12/2011 | Fillingim |
| 2012/0008401 A1 | 1/2012 | Katz et al. |
| 2012/0063227 A1 | 3/2012 | Weingarten et al. |
| 2012/0236655 A1 | 9/2012 | Yang |
| 2012/0268994 A1 | 10/2012 | Nagashima |
| 2013/0219108 A1 | 8/2013 | Yang |

FOREIGN PATENT DOCUMENTS

| | | |
|---|---|---|
| JP | 2009541909 | 11/2009 |
| JP | 2010509700 | 3/2010 |
| JP | 2010522924 | 7/2010 |
| JP | 2010-2378222 | 10/2010 |
| JP | 2011100519 | 5/2011 |
| KR | 10-2010-0021497 | 2/2010 |
| KR | 10-2010-0028924 | 3/2010 |
| WO | 2007149677 | 12/2007 |
| WO | 2008057822 | 5/2008 |
| WO | 2008117921 | 10/2008 |
| WO | 2012-058328 | 5/2012 |

OTHER PUBLICATIONS

International Search Report and Written Opinion of international application No. PCT/US2013/073348, dated Mar. 13, 2014, 11 pages.

Notice of Rejection for related Taiwan Patent Application No. 102144971, dated Nov. 3, 2015, 22 pages.

European Search Report and Written Opinion for related EP Patent Application No. 13860569.6, dated Jul. 5, 2016, 15 pages.

Notice of Rejection for related Japan Patent Application No. 2015-545845, dated Jul. 19, 2016, 17 pages.

Notice of Preliminary Rejection for related Korea Patent Application No. 10-2015-7017670, dated May 11, 2016, 10 pages.

Notice of Rejection for related Japan Patent Application No. 2015-545845, dated Nov. 29, 2016, 6 pages.

Office Action for related China Patent Application No. 201380072137.1, dated Aug. 29, 2017, 8 pages.

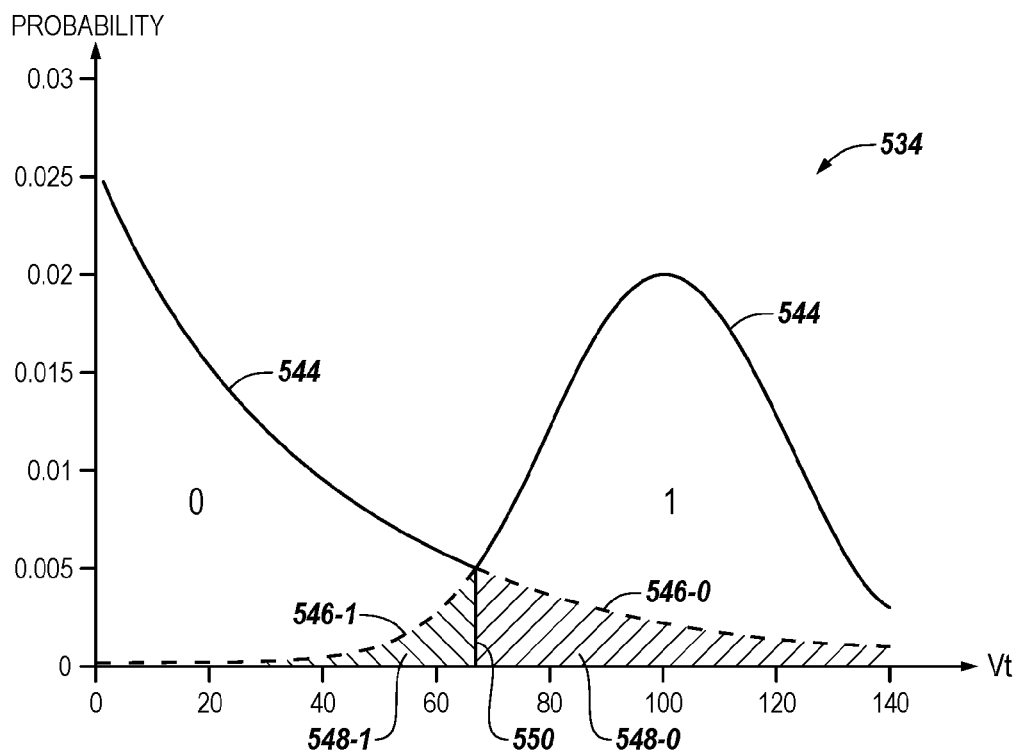
Fig. 5 *(PRIOR ART)*
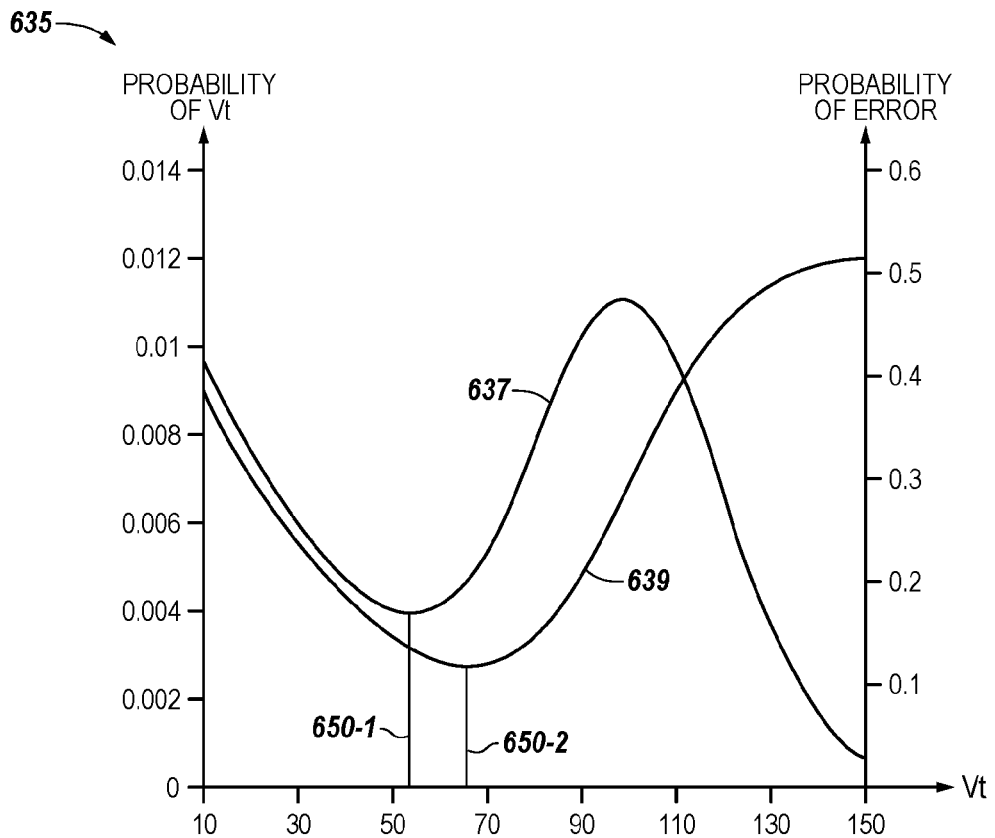
Fig. 6

SETTING A DEFAULT READ SIGNAL BASED ON ERROR CORRECTION

PRIORITY INFORMATION

This application is a Divisional of U.S. application Ser. No. 14/977,088, filed Dec. 21, 2015, which is a Divisional of U.S. application Ser. No. 13/706,851, filed Dec. 6, 2012, which issued as U.S. Pat. No. 9,257,203 on Feb. 9, 2016, the contents of which are included herein by reference.

TECHNICAL FIELD

The present disclosure relates generally to semiconductor memory and methods, and more particularly, to apparatuses and methods related to setting a default read signal based on error correction.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error data, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is utilized as volatile and non-volatile data storage for a wide range of electronic applications. Non-volatile memory may be used in portable electronic devices, such as laptop computers, portable memory sticks, digital cameras, cellular telephones, portable music players such as MP3 players, movie players, and other electronic devices. Memory cells can be arranged into arrays, with the arrays being used in memory devices.

BRIEF DESCRIPTION OF THE DRAWINGS

FIG. 5 illustrates a plot of two threshold voltage distributions associated with adjacent data states according to some previous approaches.

FIG. 6 illustrates a plot of a combined threshold voltage distribution and an error probability distribution in accordance with a number of embodiments of the present disclosure.

DETAILED DESCRIPTION

Figure 1:
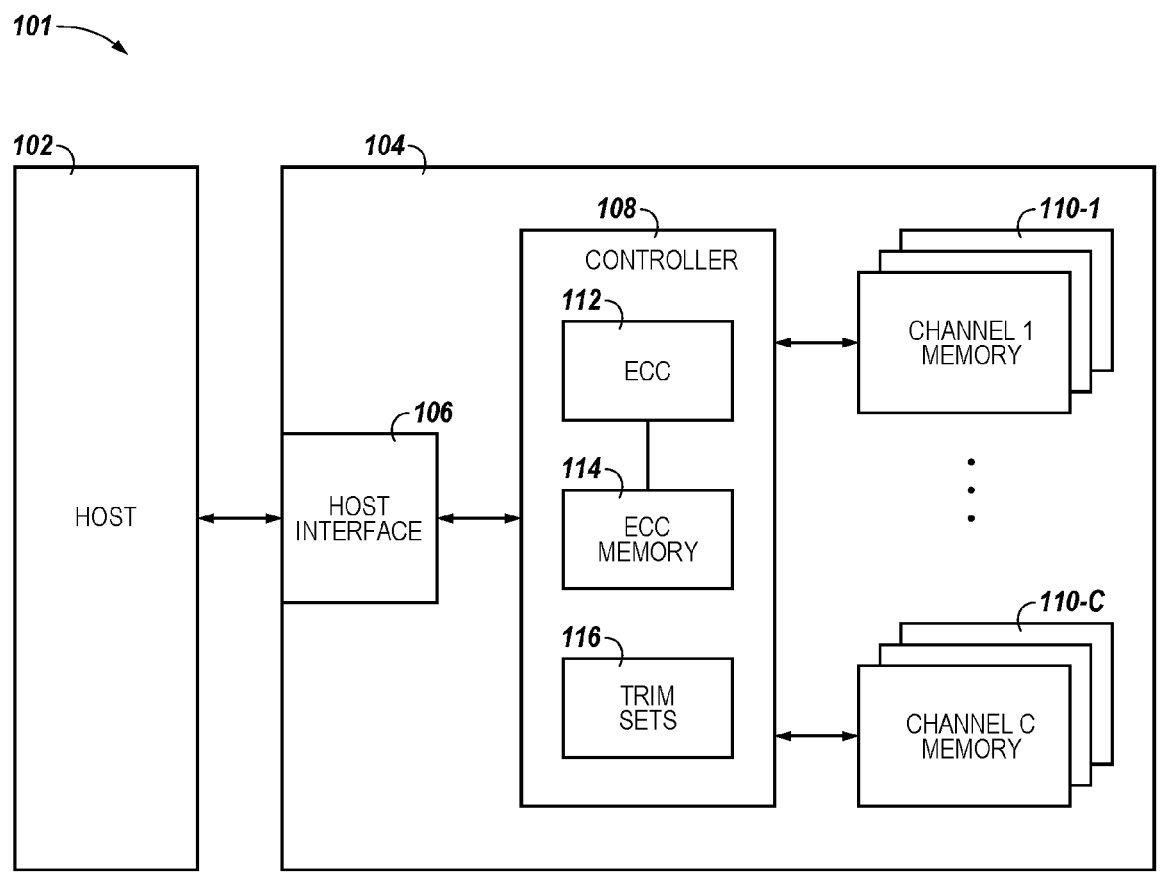
FIG. 1 is a block diagram of an apparatus in the form of a computing system including at least one memory system in accordance with a number of embodiments of the present disclosure.

The present disclosure includes apparatuses and methods related to setting a default read signal based on error correction. A number of methods can include reading a page of data from a group of memory cells with a first discrete read signal and error correcting at least one codeword of the page of data as read with the first discrete read signal. Methods can include reading a page of data from the group of memory cells with a second discrete read signal different than the first discrete read signal and error correcting at least one codeword of the page of data as read with the second discrete read signal. One of the first and the second discrete read signals can be set as a default read signal based at least in part on the respective error corrections.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "B", "C", "N", "M", and "P", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 550 may reference element "50" in FIG. 5, and a similar element may be referenced as 650 in FIG. 6. As will be appreciated, elements shown in the various embodiments herein can be added, exchanged, and/ or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 101 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, . . . , 110-C (e.g., solid state memory devices such as NAND flash devices), which provide a storage volume for the memory system 104. The memory system 104 can be a single memory device.

As illustrated in FIG. 1, the controller 108 can be coupled to the host interface 106 and to the memory devices 110-1, . . . , 110-C via a plurality of channels and can be used to send data between the memory system 104 and a host 102. The interface 106 can be in the form of a standardized interface. For example, when the memory system 104 is used for data storage in a computing system 101, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., having an on-die controller).

The controller 108 can communicate with the number of memory devices 110-1, . . . , 110-C (which in some embodiments can be a number of memory arrays on a single die) to control data read, write, and erase operations, among other operations. In some embodiments, the controller 108 can be on the same die or a different die than any or all of the number of memory devices 110.

Although not specifically illustrated, in some embodiments, the controller 108 can include a discrete memory channel controller for each channel coupling the controller 108 to the memory devices 110-1, . . . , 110-C. The controller 108 can include, for example, a number of components in the form of hardware and/or firmware (e.g., one or more integrated circuits) and/or software for controlling access to the number of memory devices 110-1, . . . , 110-C and/or for facilitating data transfer between the host 102 and memory devices 110-1, . . . , 110-C.

As illustrated in FIG. 1, the controller 108 can include an error correction circuit 112 and an error correction memory 114. For example, the error correction circuit 112 can include an algebraic error correction circuit such as one of the group including a Bose-Chaudhuri-Hocquenghem (BCH) error correction circuit and a Reed Solomon error correction circuit, among other types of error correction circuits. The error correction memory 114 can include volatile (e.g., DRAM, SRAM, etc.) and/or non-volatile (e.g., flash, MRAM, etc.) memory. In a number of embodiments, the error correction memory 114 can be provided by the memory devices 110-1, . . . , 110-C. Each of the error correction circuit 112 and an error correction memory 114 can be discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, each of the error correction circuit 112 and an error correction memory 114 can be external to the controller 108 or have a number of components located within the controller 108 and a number of components located external to the controller 108.

The error correction circuit 112 can have an error correction capacity number of errors for a page of data. That is, if the page has fewer errors than the error correction capacity number of errors of the error correction circuit 112, then the page of data can be corrected. If the page has more errors, then an uncorrectable error can be reported. The error correction circuit 112 can correct up to a threshold number of bit errors per page of data (or codeword, where a page of data can include one codeword, more than one codeword, or less than a full codeword). A codeword can be an amount of data encoded with error correction data. The error correction circuit 112 can be configured to operate on a codeword basis. However, depending on the application-specific or device-specific configuration, the error correction circuit can be said to have an error correction capacity for a page of data (depending on the interplay between page length and codeword length in terms of numbers of bits).

The controller 108 can also include a number of trim sets 116. The trim sets 116 can each set a default read signal for the memory devices 110-1, . . . , 110-C. For example, trim sets can set a default read signal for pages, blocks, planes, dice, channels, logical units, and/or other units of memory. In a number of embodiments, the controller 108 can be configured to read data from a group of memory cells (e.g., a physical page of memory cells) within one of a plurality of dice with a plurality of discrete read signals. The controller can adjust a trim set 116 to set one of the plurality of read signals as the default read signal for the particular die. The controller 108 can include a trim set 116 for each page, block, plane, die, channel, logical unit and/or other unit of memory or the controller 108 can store a trim set 116 for groups of the units of memory. For example, a first trim set 116 can set a default read signal for a first die while a second trim set 116 can set a default read signal for a second die and a third die. The trim sets 116 for individual units of memory can be adjusted based at least in part on reading and error correcting data read from the individual units of memory, or based at least in part on reading and error correcting data read from other units of memory (e.g., reading and error correcting data from a group of memory cells in a first die can provide a default read signal for a number of groups of memory cells in the first die and a number of groups of memory cells in a second die). The controller 108 can include one trim set 116 for each memory unit (e.g., die) or the controller can include fewer trim sets 116 than the number of memory units.

The number of memory devices 110-1, . . . , 110-C can include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory (e.g., memory devices 110-1, . . . , 110-C of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

According to a number of embodiments of the present disclosure, the controller 108 can be configured to read data from a group of memory cells (e.g., a physical page of memory cells) of a memory array a plurality of times with a respective plurality of discrete read signals each having a different magnitude. The controller 108 (e.g., via error correction circuit 112) can error correct the data read from the group of memory cells with the plurality of discrete read signals and set one of the plurality of discrete read signals as a default read signal based at least in part on the error correction. After each reading and error correction, the controller 108 can store a number of errors corrected for the data read with each respective read signal in the error correction memory 114. In some embodiments, the controller 108 can set as the default, the read signal that results in the fewest errors based at least in part on the error correction results stored in the error correction memory 114. The data read from the group of memory cells can include user data (e.g., as opposed to test data from a known test data pattern). Such embodiments can be beneficial in reducing time used by writing test data and/or reducing wear on the memory 110-1, . . . 110-C from a number of program/erase cycles associated with writing test data. The data can be read, for the purposes of setting a default read signal, as a test operation (although reading user data rather than separately written test data). The test operation can be performed during idle time of the memory apparatus 110-1 . . . 110-C from which the data is read. Idle time can include time during which host operations are not being performed with respect to the memory device 110-1, . . . 110-C.

Figure 2:
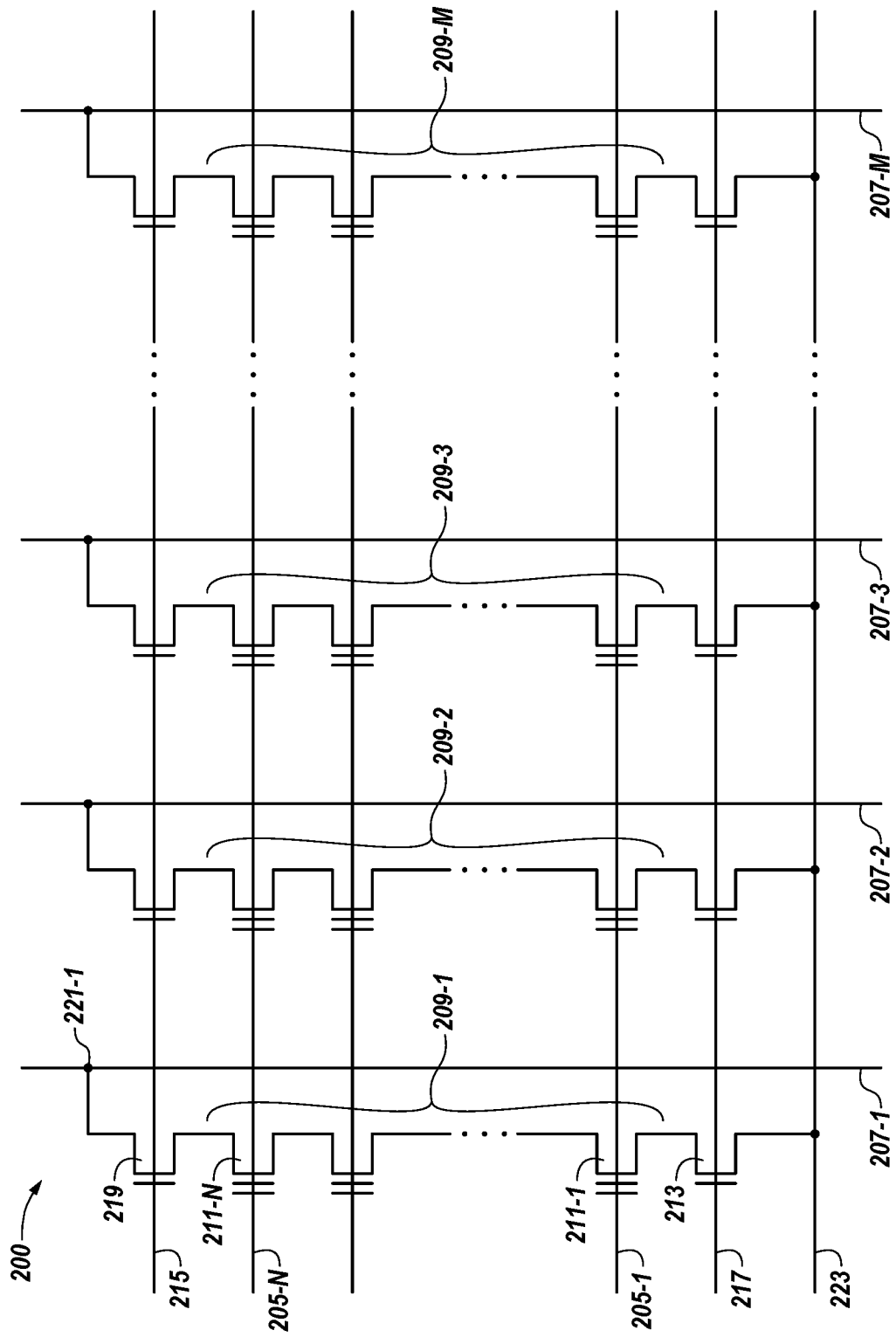
FIG. 2 illustrates a schematic diagram of a portion of a non-volatile memory array in accordance with a number of embodiments of the present disclosure.

FIG. 2 illustrates a schematic diagram of a portion of a non-volatile memory array in accordance with a number of embodiments of the present disclosure. The embodiment of FIG. 2 illustrates a NAND architecture non-volatile memory array. However, embodiments described herein are not limited to this example. As shown in FIG. 2, the memory array 200 includes access lines (e.g., word lines 205-1, . . . , 205-N) and intersecting data lines (e.g., local bit lines 207-1, 207-2, 207-3, . . . , 207-M). For ease of addressing in the digital environment, the number of word lines 205-1, . . . , 205-N and the number of local bit lines 207-1, 207-2, 207-3, . . . , 207-M can be some power of two (e.g., 256 word lines by 4,096 bit lines).

Memory array 200 includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . , 207-M. The memory cells 211-1, . . . , 211-N of each NAND string 209-1, 209-2, 209-3, . . . , 209-M are coupled in series source to drain between a source select gate (SGS) (e.g., a field-effect transistor (FET) 213) and a drain select gate (SGD) (e.g., FET 219). Each source select gate 213 is configured to selectively couple a respective NAND string to a common source 223 responsive to a signal on source select line 217, while each drain select gate 219 is configured to selectively couple a respective NAND string to a respective bit line responsive to a signal on drain select line 215.

As shown in the embodiment illustrated in FIG. 2, a source of source select gate 213 is coupled to a common source line 223. The drain of source select gate 213 is coupled to the source of the memory cell 211-1 of the corresponding NAND string 209-1. The drain of drain select gate 219 is coupled to bit line 207-1 of the corresponding NAND string 209-1 at drain contact 221-1. The source of drain select gate 219 is coupled to the drain of the last memory cell 211-N (e.g., a floating-gate transistor) of the corresponding NAND string 209-1.

In a number of embodiments, construction of the non-volatile memory cells 211-1, . . . , 211-N includes a source, a drain, a floating gate or other charge storage structure, and a control gate. The memory cells 211-1, . . . , 211-N have their control gates coupled to a word line, 205-1, . . . , 205-N, respectively. A NOR array architecture would be similarly laid out, except that the string of memory cells would be coupled in parallel between the select gates. Furthermore, a NOR architecture can provide for random access to the memory cells in the array (e.g., as opposed to page-based access as with a NAND architecture).

A number (e.g., a subset or all) of cells coupled to a selected word line (e.g., 205-1, . . . , 205-N) can be written and/or read together as a group. A number of cells written and/or read together can correspond to a page of data. As used herein, examples of high-level operations are referred to as writing or reading operations (e.g., from the perspective of a controller), whereas, with respect to the memory cells, such operations are referred to as programming or sensing. A group of cells coupled to a particular word line and programmed together to respective states can be referred to as a target page. A programming operation can include applying a number of program pulses (e.g., 16V-20V) to a selected word line in order to increase the threshold voltage (Vt) of selected cells coupled to that selected word line to a desired program voltage level corresponding to a targeted state.

Read operations can include sensing a voltage and/or current change of a bit line coupled to a selected cell in order to determine the state of the selected cell. The read operation can include precharging a bit line and sensing the discharge when a selected cell begins to conduct. Two different types of read operations are described herein (e.g., those using a ramping read signal versus using a plurality of discrete read signals).

Sensing the state of a selected cell can include providing a ramping read signal (e.g., −2V to +3V) to a selected word line, while providing a signal (e.g., a pass voltage such as 4.5V) to word lines coupled to the unselected cells of the string sufficient to place the unselected cells in a conducting state independent of the charge stored on the unselected cells. Alternatively, sensing the state of a selected cell could include applying discrete read signals (e.g., −0.05V, 0.5V, and 2V) to a selected word line, and thus to the control gate of a selected cell. The bit line corresponding to the selected cell being read and/or verified can be sensed to determine whether or not the selected cell conducts in response to the particular read signal applied to the selected word line. For example, the state of a selected cell can be determined by the word line voltage at which the bit line current reaches a particular reference current associated with a particular state.

According to a number of embodiments of the present disclosure, default read signals can be set based on location within a string of memory cells 209-1, 209-2, 209-3, ..., 209-M. For example, with respect to FIG. 2, those memory cells coupled to word line 205-1 along an edge of the strings 209-1, 209-2, 209-3, ..., 209-M closer to source select gate 213 may have a different default discrete read signal than those memory cells coupled to word line 205-N along and edge of the strings 209-1, 209-2, 209-3, ..., 209-M closer to drain select gate 219. Data can be read from a first group of memory cells with a plurality of discrete read signals, where reading the first group of memory cells includes sensing a first memory cell 211-1 from a particular string 209-1 of memory cells. Data can be read from a second group of memory cells with the discrete read signals including sensing a second memory cell 211-N from the particular string 209-1 of memory cells. A first one of the discrete read signals that results in (e.g., returns, generates, etc.) the fewest number of errors during error correction of the data read from the first group of memory cells can be set as a default read signal for with memory cells coupled to a same word line 205-1 as the first memory cell 211-1. A second one of the discrete read signals that results in the fewest number of errors during error correction of the data read from the second group of memory cells can be set as a default read signal for memory cells coupled to a same word line 205-N as the second memory cell 211-N.

Setting a default read signal based on location within a string of memory cells 209-1, 209-2, 209-3, ..., 209-M can include setting a default read signal for each location (e.g., word line) within the string of memory cells 209-1, 209-2, 209-3, ..., 209-M or for groups of locations (e.g., more than one word line). For example, a default read signal can be set for memory cells coupled to a particular word line and a number of word lines adjacent thereto. The adjacent word lines can be directly adjacent to the particular word line or within a threshold number of word lines proximal to the particular word line. In a number of embodiments, a first default read signal can be set for a particular location (e.g., word line) within a string 209-1, 209-2, 209-3, ..., 209-M and a second default read signal can be set for other locations (e.g., more than one other word line) within the string 209-1, 209-2, 209-3, ..., 209-M.

Default read signals can be set based on an odd and even page basis. Pages of memory cells can be divided between odd and even numbered memory cells along a word line. In one or more embodiments, an "odd" or "even" page of data can be a logical representation of data where data from half (the "odd" numbered) of the memory cells coupled to a word line are stored in an "odd" page and data from the other half (the "even" numbered) of the memory cells coupled to the word line are stored in an "even" page. For example, memory cells selectively coupled to a particular word line 205-1 and to bit lines 207-1, 207-3, and other odd numbered bit lines may be said to store an odd page of data while memory cells coupled to word line 205-1 and bit lines 207-2, and other even numbered bit lines, and 207-M may be said to store an even page of data. Other examples are provided below with respect to FIG. 3. Different default read signals can be set for upper pages of data and lower pages of data.

Data from a first group of memory cells can be read with a plurality of discrete read signals, where reading the data includes sensing a first portion of the plurality of memory cells coupled to a word line. Data from a second group of memory cells can be read with the discrete read signals, where reading the data from the second group of memory cells can include sensing a second portion of the memory cells coupled to the word line. A first one of the discrete read signals that results in the fewest number of errors during error correction of the data read from the first group of memory cells can be set as a default read signal for memory cells coupled to the same bit lines as the first portion of the plurality of memory cells. A second one of the discrete read signals that results in the fewest number of errors during error correction of the data read from the second group of memory cells can be set as a default read signal for memory cells coupled to the same bit lines as the second portion of the plurality of memory cells.

Figure 3:
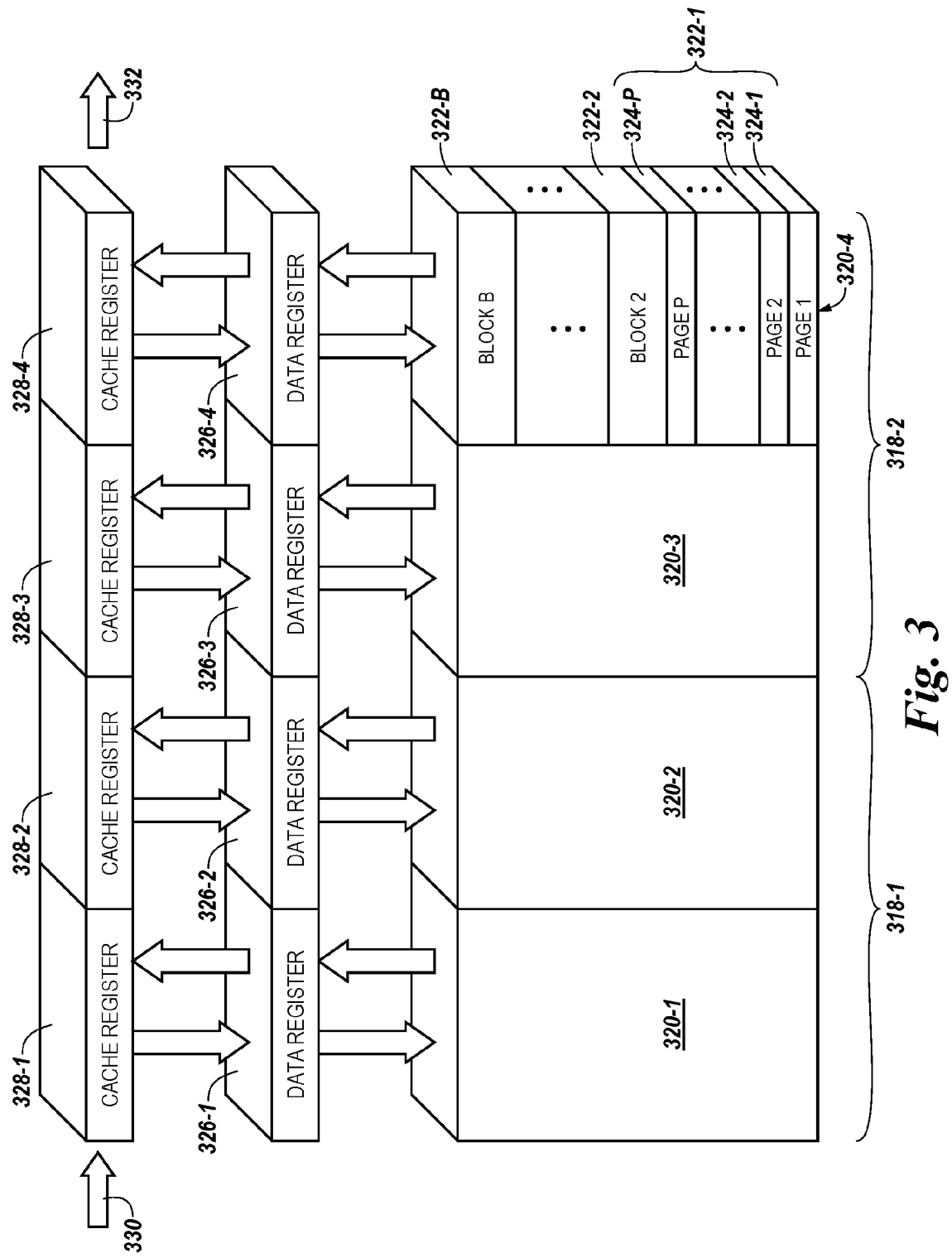
FIG. 3 illustrates a block diagram of a memory architecture in accordance with a number of embodiments of the present disclosure.

FIG. 3 illustrates a block diagram of a memory architecture in accordance with a number of embodiments of the present disclosure. FIG. 3 includes two memory dice 318-1 and 318-2 with two planes each, 320-1, 320-2, 320-3, and 320-4. Each plane includes a number of blocks 322-1, 322-2, ..., 322-B. As described herein, a block of memory cells can be erased together in one erase operation. Each block includes a number of pages (e.g., pages 324-1, 324-2, ..., 324-P, included in block 1, 322-1). As described herein, a page of memory cells can be written or read together in one write or read operation. Each plane is in bidirectional communication with a data register 326-1, 326-2, 326-3, 326-4 respectively. Each data register is in bidirectional communication with a cache register 328-1, 328-2, 328-3, 328-4 respectively.

Data can be transferred from a data register 326-1, 326-2, 326-3, 326-4 to a memory plane 320-1, 320-2, 320-3, 320-4 during write operations. Data can be transferred from a memory plane 320-1, 320-2, 320-3, 320-4 to a data register 326-1, 326-2, 326-3, 326-4 during read operations. A cache register 328-1, 328-2, 328-3, 328-4 can output data to input/output (I/O) circuitry at 332 and can receive data from I/O circuitry at 330. Although not specifically illustrated, each cache register can have a separate I/O path. A cache register 328-1, 328-2, 328-3, 328-4 can communicate data with I/O circuitry through a number of data cycles. During non-cache operations, the data registers 326-1, 326-2, 326-3, 326-4 and cache registers 328-1, 328-2, 328-3, 328-4 can operate together as single registers.

During cache operations, data registers 326-1, 326-2, 326-3, 326-4 and cache registers 328-1, 328-2, 328-3, 328-4 can operate separately in a pipelined process. For example, a next sequential access from the array can be pipelined while outputting previously-accessed data. Such a double-buffered technique can allow read access time to be hidden. Data can be first transferred from a memory array to a data register 326-1, 326-2, 326-3, 326-4. If the cache register 328-1, 328-2, 328-3, 328-4 is available (not busy), the data can be moved from the data register 326-1, 326-2, 326-3, 326-4 to the cache register 328-1, 328-2, 328-3, 328-4. Once the data is transferred to the cache register 328-1, 328-2, 328-3, 328-4, the data register 326-1, 326-2, 326-3, 326-4 is available and can start to load the next sequential page from the memory array.

Plane 320-1 can represent half of the blocks on die 318-1, while plane 320-2 can represent the other half. Plane 320-3 can represent half of the blocks on die 318-2, while plane 320-4 can represent the other half. In one or more embodiments, planes can be divided between odd and even numbered blocks. In one or more embodiments, an "odd" or "even" plane of data can be a logical representation of data where data units from half (the "odd" numbered) of the memory cells coupled to access lines associated with the die are stored in an "odd" plane and data units from the other half (the "even" numbered) of the memory cells coupled to access lines associated with the die are stored in an "even" plane. Embodiments are not limited to a particular plane representing half of the blocks on a given die having more than one plane; other distributions of blocks between planes are possible. Nor are embodiments limited to memory devices with a particular number of blocks, planes, or dice. According to a number of embodiments of the present disclosure, default read signals can be set for a number of dice 318-1, 318-2, a number of planes 320-1, 320-2, 320-3, 320-4, a number of blocks 322-1, 322-2, . . . , 322-B, and/or a number of pages 324-1, 324-2, . . . , 324-P of memory cells.

Figure 4:
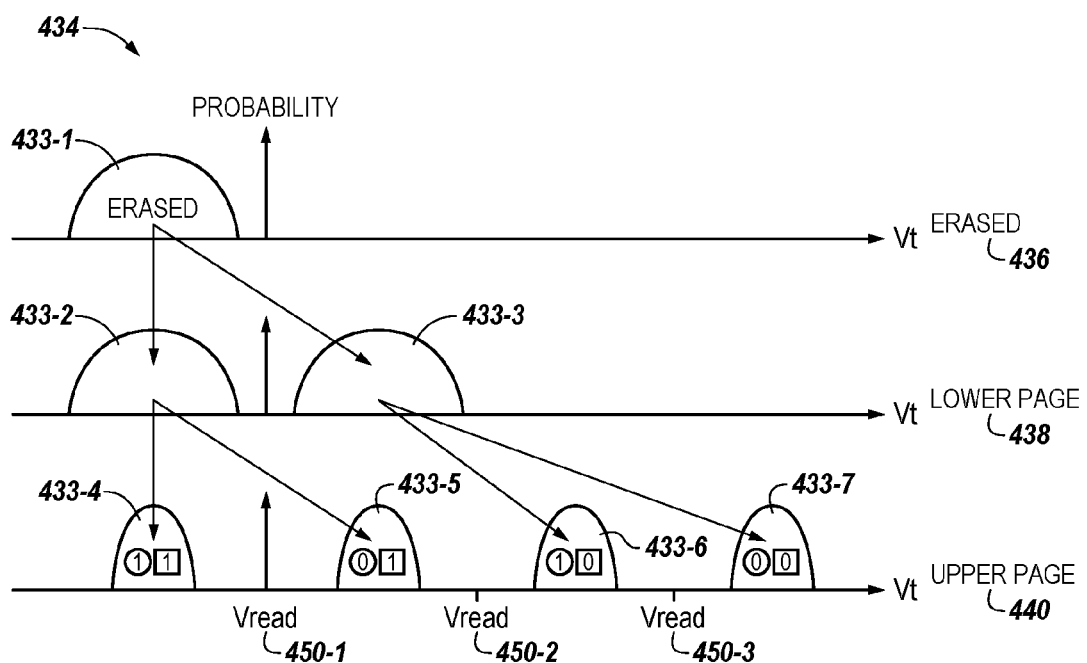
FIG. 4 illustrates a diagram of threshold voltage distributions associated with an example 2-bit memory cell in accordance with a number of embodiments of the present disclosure.

FIG. 4 illustrates a diagram 434 of threshold voltage distributions 433 associated with an example 2-bit memory cell in accordance with a number of embodiments of the present disclosure. Embodiments are not limited to multilevel memory cells being programmed with two bits of data. One or more embodiments of the present disclosure can include a particular memory cell being programmed with more than two bits and/or a fractional number of bits of data.

As part of an erase operation 436, the Vt of a memory cell can be placed in a Vt distribution 433-1. As part of a lower page programming operation 438, one or more programming pulses can be applied to memory cells to program the cells to one of a number of intermediate Vt distributions (e.g., Vt distributions 433-2 and 433-3). In this example, those cells whose lower page is to be programmed with data "1" are programmed to intermediate Vt distribution 433-2 and those cells whose lower page is to be programmed with data "0" are programmed to intermediate Vt distribution 433-3 during lower page programming operation. Subsequently, as part of an upper page programming operation 440, one or more programming pulses can be applied to the memory cells to program the cells from one of the intermediate Vt distributions 433-2 and 433-3 to one of Vt distributions 433-4, 433-5, 433-6, and 433-7, which correspond to data states 11, 01, 10, and 00, respectively. In this example, cells whose lower page is programmed with data "1" are programmed from Vt distribution 433-2 to one of Vt distributions 433-4 or 433-5 during upper page programming 440. Those cells whose lower page is programmed with data "0" are programmed from Vt distribution 433-3 to one of Vt distributions 433-6 or 433-7 during upper page programming 440. In this 2-bit memory cell example, the least significant bit (shown inside squares in FIG. 4) of a data state corresponds to the lower page of data and the most significant bit (shown inside circles in FIG. 4) of a data state corresponds to the upper page of data. As an example, cells programmed to Vt distribution 433-6 store data "10", with "0" corresponding to the lower page data and "1" corresponding to the upper page data. However, embodiments are not limited to 2-bit cells or to the particular data values illustrated in FIG. 4.

For a particular programming operation, a lower page of data and a corresponding upper page of data are programmed to the same physical memory cells (e.g., the same physical page of memory cells). As will be appreciated, methods for programming multilevel memory cells with a number of bits other than two can be extrapolated from the description herein. For example, a 3-bit memory cell can be programmed with a lower page of data and a number of middle pages of data before being programmed with an upper page of data to a final state. Embodiments described herein with a 2-bit cell are illustrative for purposes of explanation, and do not limit the present disclosure to operation of 2-bit memory cells. Furthermore, the use of "1s" and "0s" and the terms "upper" and "lower" are used herein to illustrate examples and are do not limit the present disclosure to a particular notation or data arrangement.

The diagram 434 includes an illustration of a number of read signals (e.g., Vread) 450-1, 450-2, 450-3. Read signal 450-2 can be used as part of a read operation of a lower page to distinguish data states 11 and 01 from data states 10 and 00. For example, if lower page read signal 450-2 is applied and a particular memory cell conducts in response, then the particular memory cell is in one of data states 11 and 01, which indicates that the lower page bit is 1. However, if read signal 450-2 is applied and the particular memory cell does not conduct, then the particular memory cell is in one of data states 10 and 00, which indicates that the lower page bit is 0. First upper page read signal 450-1 can be used to distinguish data state 11 from 01. Second upper page read signal 450-3 can be used to distinguish data state 10 from 00.

A number of embodiments of the present disclosure can be used to set the magnitude of one or more of the read signals 450-1, 450-2, 450-3. For example, to set the magnitude of lower page read signal 450-2, a group of memory cells can be read with a first plurality of lower page discrete read signals (e.g., where each discrete read signal has a different magnitude in the range of read signal 450-2 as illustrated in FIG. 4). Read signals can be in the range of read signal 450-2 by including those magnitudes between data states 01 and 10 and/or potentially including magnitudes that are within portions of data states 01 and 10 in order to set a default magnitude of the read signal 450-2.

The data read from the group of memory cells using the plurality of lower page discrete read signals, for example at least one codeword, can be error corrected. One of the first plurality of discrete read signals can be set as a default read signal for the lower page of data based at least in part on the error correction. A number of errors corrected during error correction after each reading of the group of memory cells for each of the plurality of discrete read signals can be counted (for those discrete read signals that do not result in an uncorrectable error) and compared to set one of the discrete read signals as a default read signal based at least in part on the comparison (e.g., one of the discrete read signals that results in the fewest number of errors). Such a process can be repeated with different pluralities of discrete read signals to set default read signal magnitudes for each of read signals 450-1 and 450-3. For example, first upper page data from the group of memory cells can be read with each of a second plurality of discrete read signals (e.g., in the range of read signal 450-1). The first upper page data read from the group can be error corrected for each reading thereof and one of the second plurality of discrete read signals can be set as a default for the first upper page based at least in part on the error correction. Second upper page data can be read from the group of memory cells with each of a third plurality of discrete read signals (e.g., in the range of read signal 450-3). Error correction can be performed for each reading thereof and one of the third plurality of discrete read signals can be set as the default for the second upper page of data based at least in part on the error correction.

Reading the data can entail reading a particular type of page of data such as a lower page, middle page (not specifically illustrated), or upper page of data. Thus, a default read signal can be set for a particular page type. Although not specifically illustrated, the above-described process can be repeated to set a default read signal for reading a middle page of data. As illustrated in FIG. 4, the upper page of data can be read with two discrete read signals 450-1 and 450-3. More than one default read signal can be set for page types that are read with more than one discrete read signal. A different default read signal can be set for upper page data than for lower page data.

FIG. 5 illustrates a plot 534 of two threshold voltage distributions associated with adjacent data states according to some previous approaches. The plot 534 includes a first threshold voltage (Vt) distribution (e.g., for data state 0) and a second Vt distribution (e.g., for data state 1). The x-axis of the plot 534 illustrates increasing Vt and the y-axis illustrates increasing probability (population of the Vt distribution). Such information can be gathered, for instance, from soft data associated with a read operation. For example, a page of memory cells can be read and soft data can be obtained from the use of a voltage ramp, which can indicate a more exact charge stored on a particular memory cell or from using a more than one discrete read signal for each particular data state to more accurately determine the charge stored on a particular memory cell. This soft data, over the page of memory cells, can result in the solid line 544 on the plot 534. That is, a memory system can determine a distribution of cells with each particular Vt level, but, from this soft data alone, it may not be clear which cells correspond to which data state. That is, soft data can indicate more exactly, a charge stored on a cell, but not to which data state the cell was supposed to be programmed.

The dashed lines 546-0 and 546-1 illustrate a remainder of the plots of the first data state 0 and the second data state 1 respectively (e.g., if perfect information were available indicating the specific charge stored on each cell and to which data state it was supposed to be programmed). Such perfect information may be available with the use of test data, where the page is programmed with known test data. According to some previous approaches, a read signal may be set based on a valley between Vt distributions for adjacent data states (here, state 0 and state 1). In FIG. 5, this read signal is illustrated at 550, which is set in the valley between state 0 and state 1. The areas 548-0 and 548-1 under the dashed lines 546-0 and 546-1 illustrate the respective errors associated with using read signal 550 to distinguish between data state 0 and data state 1. Using read signal 550 to distinguish between data state 0 and data state 1 would result in errors for those cells indicated by area 548-0, which were programmed to data state 0, but which would be read as data state 1 and for those cells indicated by area 548-1, which were programmed to data state 1, but which would be read as data state 0. For those instances when the Vt distributions for adjacent data states are non-symmetric, the errors are also non-symmetric (e.g., there are more errors represented by area 548-0 than by area 548-1). In such instances, using a read signal defined by a valley can result in more errors than would occur with a different read signal.

Rather than setting a default read signal based on a valley between Vt distributions of adjacent data states, a number of embodiments of the present disclosure can read data from a group of memory cells (e.g., a physical page) with a plurality of discrete read signals, error correct the data read with the plurality of discrete read signals, and set a default read signal based at least in part on the discrete read signal that results in a fewest number of errors. Such embodiments do not require the use of known test data or other knowledge of a correlation between data states and Vt distributions that could provide information about areas 546-0 and 546-1. Furthermore, soft data sufficient to provide a plot 534 of Vt distributions as illustrated in FIG. 5 does not have to be gathered for such embodiments because they are based at least in part on minimizing errors from multiple discrete hard reads rather than requiring soft data.

FIG. 6 illustrates a plot 635 of a combined threshold voltage distribution 637 and an error probability distribution 639 in accordance with a number of embodiments of the present disclosure. The plot 635 includes a Vt distribution 637 representing a summation of the Vt distributions for data states 0 and 1 respectively from FIG. 5. The plot 635 includes an error probability distribution 639 for a given magnitude of a read signal, where the magnitude is indicated by the x-axis. The x-axis of the plot 635 illustrates increasing Vt and/or magnitude of a read signal, the left y-axis illustrates increasing probability (population of the Vt distribution), and the right y-axis illustrates an increasing probability of error.

The plot 635 illustrates a first read level 650-1 and a second read level 650-2. The read levels can correspond to a magnitude of a discrete read signal. For example, first read level 650-1 can correspond to a magnitude of a first discrete read signal and second read level 650-2 can correspond to a magnitude of a second discrete read signal. The first read level 650-1 represents a read level that could be set according to some previous approaches that set a default read level in a valley between Vt distributions of adjacent data states. As illustrated, the first read level 650-1 is set at a minimum point in the summation Vt distribution 637 of adjacent data states 0 and 1. However, the second read level 650-2 represents a read level set according to a number of embodiments of the present disclosure based at least in part on a minimizing a number of errors that result from the read level. Along error probability distribution 639, all other read levels result in more errors, but the read level 650-2 results in a minimum number of errors, resulting in more accurate reads than would otherwise be provided by setting a read level 650-1 in a valley between Vt distributions of adjacent data states. The error probability distribution 639 can be obtained by sweeping a read level across a plurality of magnitudes, reading data page of memory cells with each read level, error correcting the data read with each read level, counting the number of errors for each read level, and extrapolating therefrom.

Figure 7A:
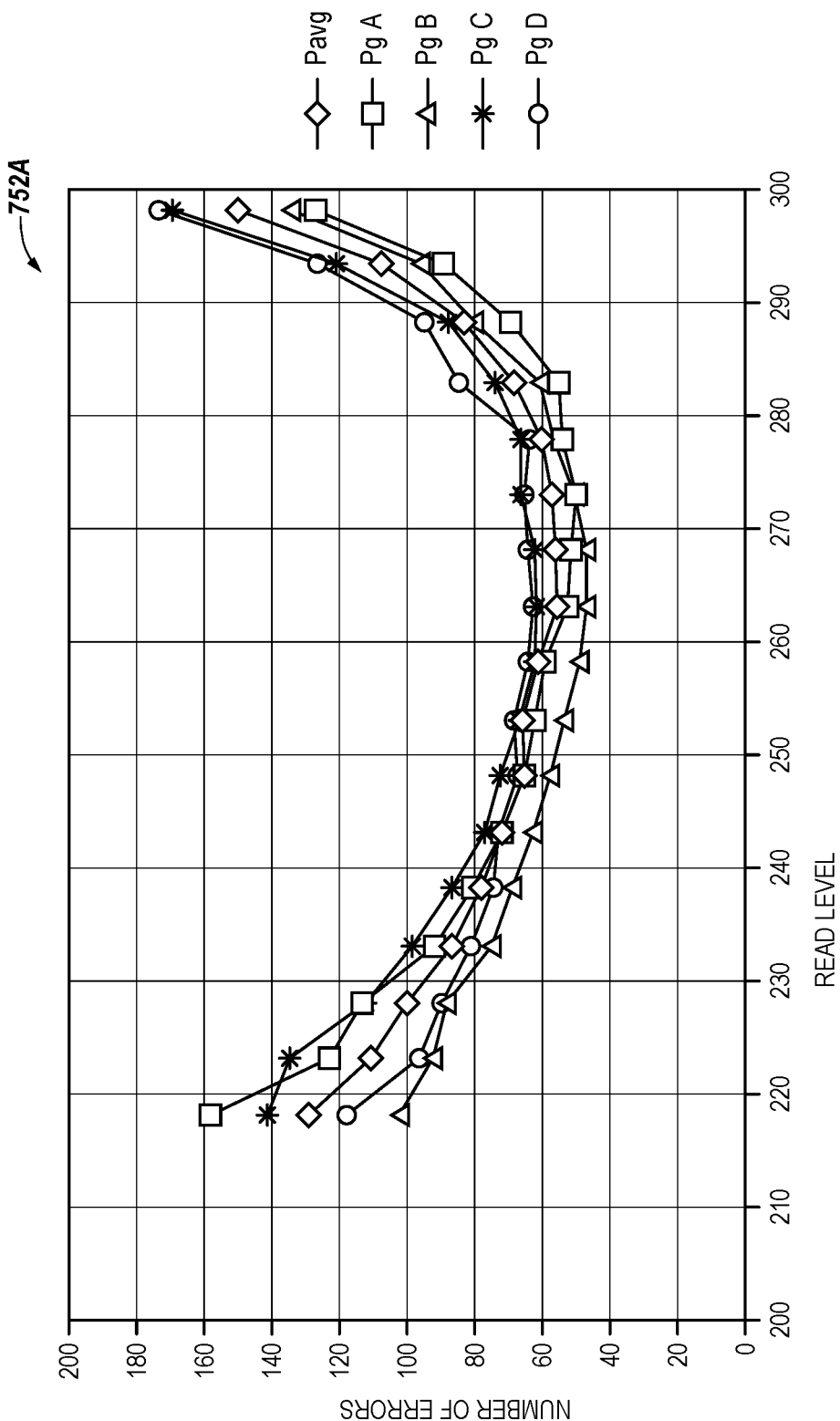
FIG. 7A illustrates a plot of a number of errors associated with reading a plurality of pages of data with a plurality of discrete read signals in accordance with a number of embodiments of the present disclosure.

FIG. 7A illustrates a plot 752A of a number of errors associated with reading a plurality of units of memory with a discrete read signal in accordance with a number of embodiments of the present disclosure. The plot 752A includes distributions of a number of errors versus magnitudes of read signals for each of four memory units (e.g., Page A, Page B, Page C, Page D) and an average of the four memory units (e.g., Pavg). The x-axis of the plot 752A illustrates increasing Vt and/or magnitude of a read signal, the y-axis illustrates an increasing probability of error. Plot 752A includes distributions for reads associated with a first data state (e.g., data state 00 and/or lower pages). The four memory units can be spatially averaged to result in Pavg. Spatial averaging can minimize noise resulting from sampling (e.g., versus simple averaging and a global minimum function). The four memory units can be topologically distributed throughout an array of memory cells, can be topologically distributed throughout a memory system (e.g., a plurality of dice), can be from a single block, or from different blocks of memory cells. A minimum (e.g., a valley) of any of the four memory units, the average of each of the minimums or the minimum of Pavg can be set as a magnitude of a default read signal.

Figure 7B:
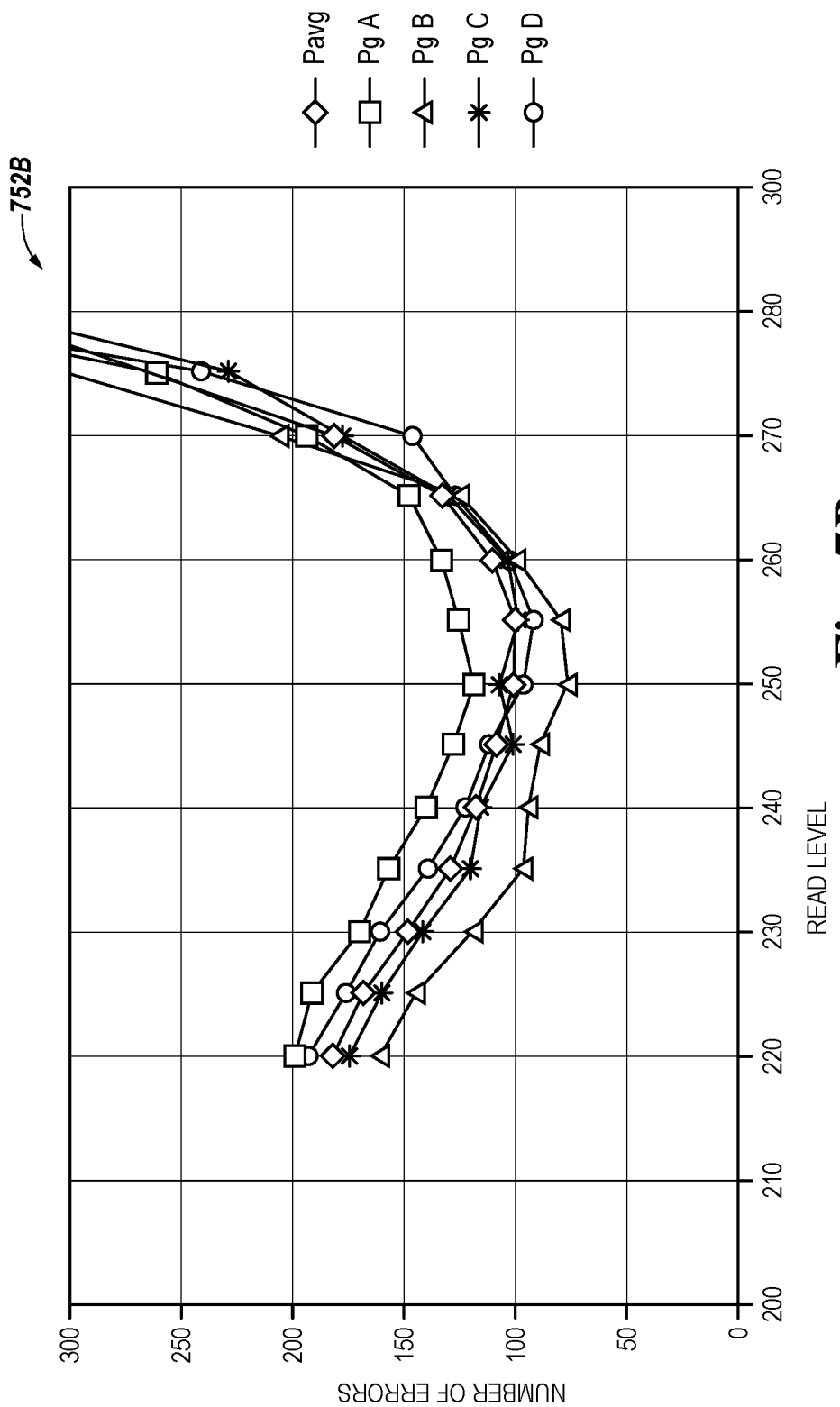
FIG. 7B illustrates a plot of a number of errors associated with reading a plurality of pages of data with a plurality of discrete read signals in accordance with a number of embodiments of the present disclosure.

FIG. 7B illustrates a plot 752B of a number of errors associated with reading a plurality of units of memory with a discrete read signal in accordance with a number of embodiments of the present disclosure. The plot 752B includes distributions of a number of errors versus magnitudes of read signals for each of four memory units (e.g., Page A, Page B, Page C, Page D) and an average of the four memory units (e.g., Pavg). The x-axis of the plot 752B illustrates increasing Vt and/or magnitude of a read signal, the y-axis illustrates an increasing probability of error. Plot 752B includes distributions for reads associated with a second data state (e.g., data state 01 and/or upper pages). The four memory units can be spatially averaged to result in Pavg. Spatial averaging can minimize noise resulting from sampling (e.g., versus simple averaging and a global minimum function). The four memory units can be topologically distributed throughout an array of memory cells, can be topologically distributed throughout a memory system (e.g., a plurality of dice), can be from a single block, or from different blocks of memory cells. A minimum (e.g., a valley) of any of the four memory units, the average of each of the minimums, or the minimum of Pavg can be set as a magnitude of a default read signal.

According to a number of embodiments of the present disclosure, reading a group of memory cells with more than one discrete read signal comprises separate hard reads rather than one soft read operation. That is, each data read with a different discrete read signal can be error corrected to determine a number of errors according to the data read with the discrete signal on a macro level (e.g., on a page and/or codeword basis), whereas with a soft read operation, each successive read (for those soft read operations using multiple discrete signals as opposed to a ramping signal) may be used to more accurately determine a particular charge stored on memory cells. Using more than one discrete read, error correcting for each read, and setting a default read signal accordingly does not provide greater detail about a charge stored on any particular memory cell, but rather can provide greater detail about which read level can provide fewer errors over a page of memory cells.

According to a number of embodiments of the present disclosure, reading a group of memory cells with more than one discrete read signal, error correcting the data read with each of the discrete read signals for each read, and setting a default read signal (e.g., to minimize a number of errors according to the error correction) is different than adjusting a read signal based on an uncorrectable error reported from error correction circuitry. For instance, some previous approaches to setting a read signal may have included incrementally adjusting a read signal that previously resulted in an uncorrectable error being reported from error correction circuitry until such an uncorrectable error is not reported. However, such an approach merely provides a read signal that passes error correction without any knowledge provided as to whether the read signal is better or worse (in terms of number of errors resulting) than any other read signal that passes error correction. Furthermore, such an approach would be likely to yield a read signal that would tend to result in a relatively high number of errors because the incremental adjustments of the read signal would tend to set the read signal distal to a valley in an error probability distribution (see, for example, error probability distribution 639 in FIG. 6). In contrast, a number of embodiments of the present disclosure can set a read signal that significantly reduces a resulting number of errors versus simply avoiding an uncorrectable error, or even setting a read level based on a valley between threshold voltage distributions for adjacent data states.

CONCLUSION

The present disclosure includes apparatuses and methods related to setting a default read signal based on error correction. A number of methods can include reading a page of data from a group of memory cells with a first discrete read signal and error correcting at least one codeword of the page of data as read with the first discrete read signal. Methods can include reading a page of data from the group of memory cells with a second discrete read signal different than the first discrete read signal and error correcting at least one codeword of the page of data as read with the second discrete read signal. One of the first and the second discrete read signals can be set as a default read signal based at least in part on the respective error corrections.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    reading lower page data from a group of memory cells with each of a plurality of lower page discrete read signals as part of a test operation during idle time of a memory apparatus;
    error correcting the lower page data read with the plurality of lower page discrete read signals;
    setting one of the plurality of lower page discrete read signals as a default lower page read signal for the group of memory cells based at least in part on the error correction;
    reading upper page data from the group of memory cells with each of a plurality of upper page discrete read signals as part of a test operation during idle time of a memory apparatus;
    error correcting the upper page data read with the plurality of upper page discrete read signals; and
    setting one of the plurality of upper page discrete read signals as a default upper page read signal for the group of memory cells based at least in part on the error correction.

2. The method of claim 1, wherein the upper page data comprises first upper page data, wherein the upper page discrete read signals comprises first upper page discrete read signals, and wherein the method includes:

reading second upper page data from the group of memory cells with each of a plurality of second upper page discrete read signals;
error correcting second upper page data read with the plurality of second upper page discrete read signals; and
setting one of the plurality of second upper page discrete read signals as a default second upper page read signal for the group of memory cells based at least in part on the error correction.

3. The method of claim 1, wherein the method includes:
reading middle page data from the group of memory cells with each of a plurality of middle page discrete read signals;
error correcting the middle page data read with the plurality of middle page discrete read signals; and
setting one of the plurality of middle page discrete read signals as a default middle page read signal for the group of memory cells based at least in part on the error correction.

4. The method of claim 1, wherein setting one of the plurality of lower page discrete read signals as a default lower page read signal for the group of memory cells comprises setting as the default lower page read signal one of the plurality of lower page discrete read signals that results in a fewest number of errors based at least in part on the error correction.

5. The method of claim 1, wherein setting one of the plurality of upper page discrete read signals as a default upper page read signal for the group of memory cells comprises setting as the default upper page read signal one of the plurality of upper page discrete read signals that results in a fewest number of errors based at least in part on the error correction.

6. The method of claim 1, further comprising error correcting the lower page of data and error correcting the upper page data as part of a test operation during idle time of a memory apparatus.

7. The method of claim 1, further comprising:
setting one of the plurality of lower page discrete signals as the default lower page read signal as part of a test operation during idle time of a memory apparatus; and
setting one of the plurality of upper page discrete read signals as the default upper page read signal as part of the test operation during idle time of the memory apparatus.

8. The method of claim 1, wherein error correcting the lower page of data further comprises error correcting at least one codeword of the lower page of data as read with at least one of the plurality of lower page discrete read signals.

9. The method of claim 1, wherein error correcting the upper page of data further comprises error correcting at least one codeword of the upper page of data as read with at least one of the plurality of upper page discrete read signals.

10. A method, comprising:
reading lower page data from a group of memory cells with a plurality of lower page discrete read signals;
counting a number of errors corrected for the lower page data read with each of the plurality of lower page discrete read signals;
comparing the number of errors corrected for each of the plurality of lower page discrete read signals;
setting one of the plurality of lower page discrete read signals as a default lower page read signal based, at least in part, on the comparison of the number of errors corrected for each of the plurality of lower page discrete read signals;

reading upper page data from the group of memory cells with a plurality of upper page discrete read signals;
counting a number of errors corrected for the upper page data read with each of the plurality of upper page discrete read signals;
comparing the number of errors corrected for each of the plurality of upper page discrete read signals; and
setting one of the plurality of upper page discrete read signals as a default upper page read signal based, at least in part, on the comparison of the number of errors corrected for each of the plurality of upper page discrete read signals.

11. The method of claim 10, wherein counting the number of errors corrected for the lower page data read comprises counting the number of errors corrected for the lower page data read with each of the plurality of lower page discrete read signals that do not return an uncorrectable error.

12. The method of claim 10, wherein counting the number of errors corrected for the upper page data read comprises counting the number of errors corrected for the upper page data read with each of the plurality of upper page discrete read signals that do not return an uncorrectable error.

13. The method of claim 10, wherein reading the lower page data comprises reading lower page user data, and wherein reading the upper page data comprises reading upper page user data.

14. The method of claim 10, wherein:
counting the number of errors corrected for the lower page data comprises counting the number of errors corrected for the lower page data during error correction after each reading of the group of memory cells with each of the plurality of lower page discrete read signals, and
counting the number of errors corrected for the upper page data comprises counting the number of errors corrected for the upper page data during error correction after each reading of the group of memory cells with each of the plurality of upper page discrete read signals.

15. A memory apparatus, comprising:
a memory including memory cells; and
a controller coupled to the memory and configured to:
read lower page data from a group of memory cells with each of a plurality of lower page discrete read signals as part of a test operation during idle time of the memory apparatus;
error correct the lower page data read with the plurality of lower page discrete read signals;
set one of the plurality of lower page discrete read signals as a default lower page read signal for the group of memory cells based at least on part on the error correction;
read upper page data from the group of memory cells with each of a plurality of upper page discrete read signals as part of a test operation during idle time of the memory apparatus;
error correct the upper page data read with the plurality of upper page discrete read signals; and
set one of the plurality of upper page discrete read signals as a default upper page read signal for the group of memory cells based at least on part on the error correction.

16. The apparatus of claim 15, wherein the controller is further configured to:
count a number of errors corrected as part of error correction for at least one codeword of the lower page data; and count a number of errors corrected as part of error correction for at least one codeword of the upper page data.

17. The apparatus of claim 15, wherein the controller is further configured to:
error correct all codewords of the lower page data; and
error correct all codewords of the upper page data.

18. The apparatus of claim 15, wherein respective lower page discrete read signals among the plurality of lower page discrete read signals have different magnitudes, and wherein respective upper page discrete read signals among the plurality of upper page discrete read signals have different magnitudes.

19. A method, comprising:
reading lower page data from a group of memory cells with each of a plurality of lower page discrete read signals;
error correcting the lower page data read with the plurality of lower page discrete read signals as part of a test operation during idle time of a memory apparatus;
setting one of the plurality of lower page discrete read signals as a default lower page read signal for the group of memory cells based at least in part on the error correction;
reading upper page data from the group of memory cells with each of a plurality of upper page discrete read signals;
error correcting the upper page data read with the plurality of upper page discrete read signals as part of a test operation during idle time of a memory apparatus; and
setting one of the plurality of upper page discrete read signals as a default upper page read signal for the group of memory cells based at least in part on the error correction.

20. A method, comprising:
reading lower page data from a group of memory cells with each of a plurality of lower page discrete read signals;
error correcting the lower page data read with the plurality of lower page discrete read signals;
setting, as part of a test operation during idle time of a memory apparatus, one of the plurality of lower page discrete read signals as a default lower page read signal for the group of memory cells based at least in part on the error correction;
reading upper page data from the group of memory cells with each of a plurality of upper page discrete read signals;
error correcting the upper page data read with the plurality of upper page discrete read signals; and
setting, as part of a test operation during idle time of a memory apparatus, one of the plurality of upper page discrete read signals as a default upper page read signal for the group of memory cells based at least in part on the error correction.

21. A memory apparatus, comprising:
a memory including memory cells; and
a controller coupled to the memory and configured to:
read lower page data from a group of memory cells with each of a plurality of lower page discrete read signals;
error correct the lower page data read with the plurality of lower page discrete read signals;
count a number of errors corrected as part of error correction for at least one codeword of lower page data;
set one of the plurality of lower page discrete read signals as a default lower page read signal for the group of memory cells based at least on part on the error correction;
read upper page data from the group of memory cells with each of a plurality of upper page discrete read signals;
error correct the upper page data read with the plurality of upper page discrete read signals;
count a number of errors corrected as part of error correction for at least one codeword of upper page data; and
set one of the plurality of upper page discrete read signals as a default upper page read signal for the group of memory cells based at least on part on the error correction.

* * * * *